(12) United States Patent
Sempliner et al.

(10) Patent No.: US 8,256,627 B2
(45) Date of Patent: Sep. 4, 2012

(54) BLANKING PANEL

(75) Inventors: Arthur T. Sempliner, Douglaston, NY (US); Berkeley T. Merchant, Santa Fe, NM (US)

(73) Assignee: Upsite Technologies, Inc., Santa Fe, NM (US)

( * ) Notice: Subject to any disclaimer, the term of this patent is extended or adjusted under 35 U.S.C. 154(b) by 0 days.

(21) Appl. No.: 13/156,194

(22) Filed: Jun. 8, 2011

(65) Prior Publication Data

US 2011/0240573 A1   Oct. 6, 2011

Related U.S. Application Data

(63) Continuation of application No. 11/972,916, filed on Jan. 11, 2008, now Pat. No. 7,959,015.

(51) Int. Cl.
*A47F 7/00* (2006.01)
(52) U.S. Cl. ........................................................ 211/26
(58) Field of Classification Search .................. 211/26, 211/183, 189; 174/35 R, 35 GC, 135, 138 R; 361/731, 683, 686, 726, 727, 725, 724; 312/265.1–265.6
See application file for complete search history.

(56) References Cited

U.S. PATENT DOCUMENTS

| | | |
|---|---|---|
| 5,959,841 A | 9/1999 | Allen et al. |
| 6,061,244 A | 5/2000 | O'Sullivan et al. |
| 6,281,433 B1 | 8/2001 | Decker et al. |
| 6,570,770 B1 | 5/2003 | Ross et al. |
| 6,695,149 B1 | 2/2004 | Cote et al. |
| 6,778,386 B2 | 8/2004 | Garnett et al. |
| 6,891,734 B2 | 5/2005 | Brooks et al. |
| 6,967,279 B2 | 11/2005 | Cerniglia et al. |
| 7,064,264 B2 | 6/2006 | Cerniglia et al. |
| 7,506,768 B2 | 3/2009 | Rassmussen et al. |
| 7,959,015 B2 * | 6/2011 | Sempliner et al. .............. 211/26 |
| 2002/0153338 A1 | 10/2002 | Orr |
| 2004/0232098 A1 | 11/2004 | Orr |
| 2006/0274508 A1 | 12/2006 | LaRiviere et al. |
| 2008/0298028 A1 | 12/2008 | Travers |
| 2008/0310126 A1 | 12/2008 | Lakoduk et al. |

FOREIGN PATENT DOCUMENTS

WO     2006044740 A2    4/2006

OTHER PUBLICATIONS

APC 1U 19-inch Black Modular Tooless Airflow Management Blanking Panel Mechanical (admitted prior art).
APC Airflow Management Blanking Panel Installation (admitted prior art).
APC AR8136BLK Blanking Panel Image (admitted prior art).

(Continued)

*Primary Examiner* — Jennifer E. Novosad
(74) *Attorney, Agent, or Firm* — St. Onge Steward Johnston & Reens LLC

(57) ABSTRACT

A snap-mount blanking panel for an equipment rack or cabinet enclosure has ergonomic grips spaced laterally inwardly and offset forwardly to permit comfortable and reliable mounting and removal of the blanking panel regardless of lateral clearance. A special stacking structure engages the grips in a manner to position a blanking panel, when stacked upon a lower blanking panel, in a fixed and stabilized relation to the lower blanking panel. The stacking features enable stable stacking of multiple units, one on top of another, without requiring external confinement of the stack.

13 Claims, 17 Drawing Sheets

OTHER PUBLICATIONS

HP Invent; "HP Filler Panels Technical Data"; Undated but believed to have been published before Jan. 11, 2008; 1 page.
APC Airflow Management Blanking Panels (admitted prior art).
HP Invent; "Rack System/E User's Manual"; Relevant pp. p. 7, p. 9, and p. 28; 2003; 42 pages.
Chatsworth Products, Inc. (CPI); "Snap-In Filler Panels Product Data Sheet"; www.chatsworth.com; Undated but believed to have been published before Jan. 11, 2008; 2 pages.
European Search Report; Application No. EP 09 70 1416; Issued: Mar. 23, 2012; Mailing Date: Apr. 2, 2012; 6 pages.

* cited by examiner

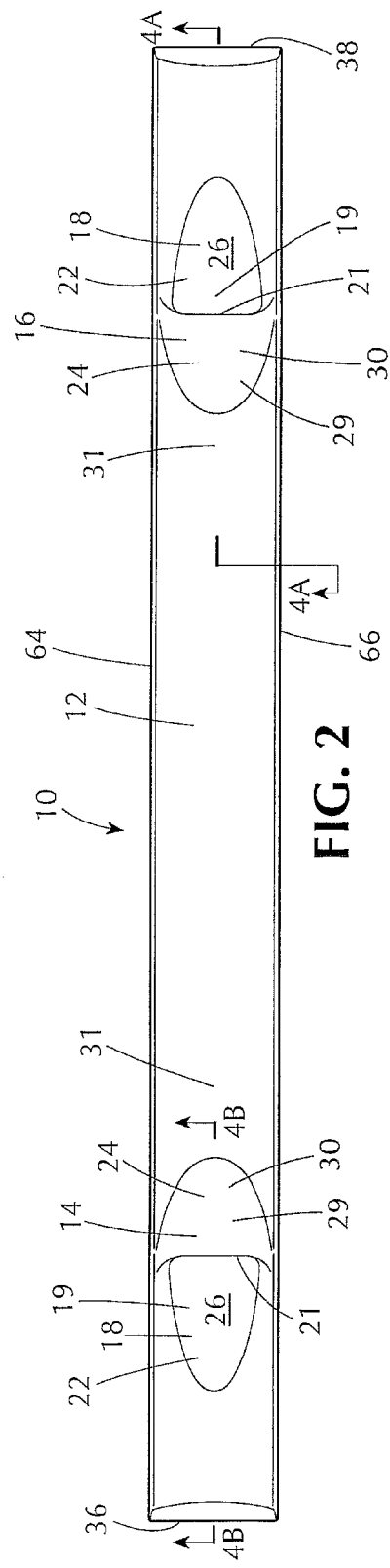
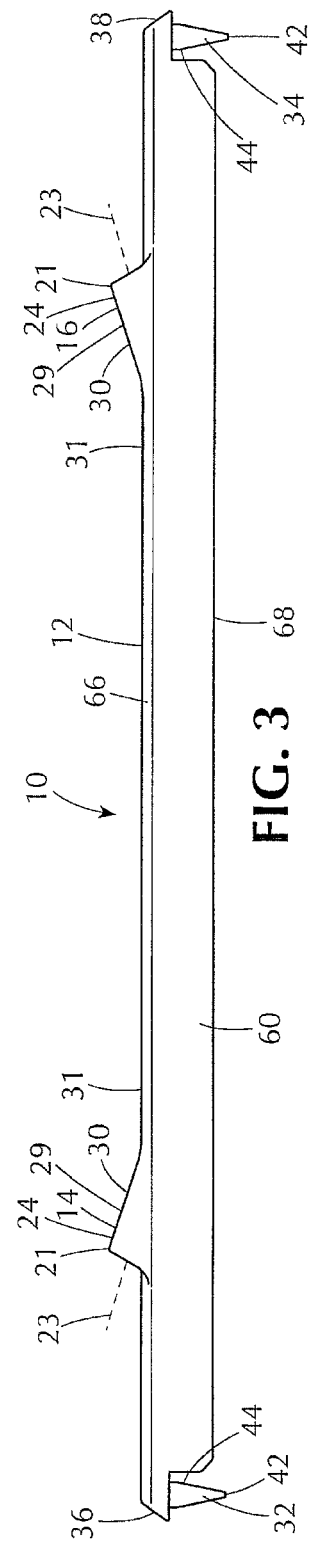

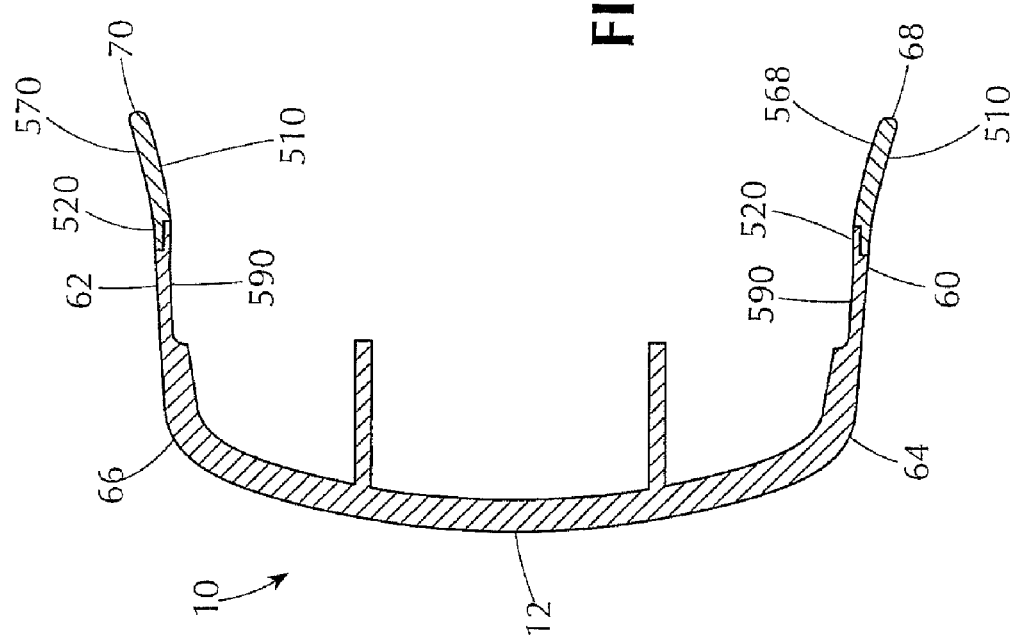

BLANKING PANEL

CROSS-REFERENCE TO RELATED APPLICATIONS

This application is a continuation of U.S. patent application Ser. No. 11/972,916 filed Jan. 11, 2008 (now U.S. Pat. No. 7,959,015, granted Jun. 14, 2011), the priority of which is hereby claimed and the content of which is incorporated herein by reference.

FIELD OF THE INVENTION

The invention pertains to the field of standardized racks and cabinet enclosures for electronic equipment and, in particular, to blanking panels for standardized equipment racks and cabinet enclosures.

BACKGROUND OF THE INVENTION

Electronic devices, such as computer servers and related computer equipment, and other electronic devices, are commonly mounted in standardized racks and cabinet enclosures having spaced-apart, (typically vertical) mounting rails with a series of holes defining a plurality of uniformly-spaced mounting locations for mounting the electronic devices in a closely-spaced, stacked manner. Standards for such racks and cabinet enclosures have been published by various trade organizations, including the Electronic Industries Alliance (EIA 310-D), the International Electrotechnical Commission (IEC 60297), and the Deutsches Institut fur Normung e.V. (DIN 41494 SC48D), which standards are hereby incorporated by reference.

Electronic devices suitable for mounting in such standardized racks and cabinet enclosures have heights substantially equal to an integer multiple of a predetermined height unit (U) of the standardized rack or cabinet enclosure (e.g., 1 U, 2 U, 3 U . . . nU). For example, a 1 U device may have a height of 44.45 mm (or 1.175 inches).

Blanking panels are often placed between electronic devices in standardized racks and cabinet enclosures to occupy unused mounting locations, primarily to control the flow of air in and around the rack or cabinet enclosure, and for organizational, safety and aesthetic reasons. As above, such blanking panels have heights substantially equal to an integer multiple of the predetermined height unit (U) of the standardized rack or cabinet enclosure (e.g., 1 U, 2 U, 3 U . . . nU).

Electronic devices and blanking panels (including the blanking panel of the present invention) which are mutually suitable for mounting in an electronic equipment rack or cabinet enclosure (constructed according to one of the above-mentioned standards, or another standard) may be described collectively herein as "conforming" or as "conforming devices."

Early blanking panels consist of a generally flat sheet of material (e.g., sheet metal) having mounting holes on opposite ends which are suitable to mount the blanking panel to the rack or cabinet enclosure using mechanical fasteners, such as screws, bolts, or captive hardware, or the like. The fasteners are inserted into the holes in the mounting rails of the standardized rack or cabinet enclosure. Later model blanking panels are integrally-formed of injection molded plastic and have snap-mount structures on each end which engage opposing surfaces of the mounting rails to securely (and removably) attach the blanking panel to the rack or cabinet enclosure.

Such prior constructions of blanking panels generally serve their intended purposes; however, flat sheet blanking panels often warp or bend and lose sealing effectiveness in the rack, and the prior snap-mount blanking panels do not provide an effective barrier to air flow. Further, the prior snap-mount blanking panels can be difficult and uncomfortable to engage and disengage from the rack or cabinet enclosure because inadequate room is available from the finger lifts or turn buttons to clear the edges of the rack or cabinet. Indeed, it is not uncommon for users of prior blanking panels to abrade or scrape their hands and knuckles on the cabinet enclosure or rack when mounting or removing the panels. Also, the physical arrangement of devices and blanking panels in racks and cabinet enclosures can be quite dynamic, requiring frequent movement of devices and reconfiguration of the blanking panels. Thus, the difficulty and discomfort involved in installing and replacing prior blanking panels can be significant.

The prior blanking panels do not allow for stable stacking of multiple blanking panels for storage and thus must be stored in a container, such as a corrugated box, which is undesirable for data centers and the like. In addition, the prior blanking panels do not provide a means for reliably measuring atmospheric conditions of the ambient area which is often desirable in data centers and the like, or provide an area for mounting signage or for a writing surface which can provide information about the rack or devices therein. Further, prior blanking panels do not provide a means to pass cable through the blanking panel.

Therefore, what is desired is an improved blanking panel for standardized electronic equipment racks and cabinet enclosures which is convenient and comfortable to engage and disengage from the rack, which provides a substantial and reliable seal against air flow in the areas immediately above and below the blanking panel, which provides for reliable, stable stacking of multiple blanking panels outside a container, which provides a reliable means for measuring atmospheric conditions in the ambient area, which provides an area for mounting signage or for a writing surface, and which provides a cable pass-through.

SUMMARY OF THE INVENTION

The invention comprises a snap-mount blanking panel for an equipment rack or cabinet enclosure of the type having spaced-apart mounting rails for mounting electronic devices and equipment. The blanking panel has a front wall, first and second end portions on opposite lateral sides of the front wall, and means for releasably connecting the blanking panel to the mounting rails in a resilient, snap-mount manner, with the front wall facing outward. The releasable connecting means is disposed on the first and second end portions of said blanking panel.

Both the first and second ergonomic grips may be used for two-handed connection and removal of the blanking panel. The first and second grips are accessible from the front of the blanking panel and are preferably engagable between a finger and thumb, but can also be engaged with one finger in some embodiments.

Each grip preferably has a finger bearing surface and a thumb bearing surface sized to engage a majority of a palmar aspect of the finger and thumb of the user, respectively, from about the DIP (distal interphalangeal) joint of the finger/thumb to about the end of the finger/thumb, respectively. The DIP joint of each finger and thumb interconnects the outermost (i.e., distal) finger/thumb bone (phalanx) to the middle finger/thumb bone and is generally located at the DIP crease—in the palmar aspect (i.e., fingerprint area) of the finger/thumb—between the distal and middle phalanges.

Each grip is spaced laterally inward from an associated adjacent end portion of the blanking panel at least about 5 cm to permit engagement of the grip by the user, with said first and second hands of the user located entirely between said first and second ends of the blanking panel. The laterally inward placement of the grips allows the user to mount and remove the blanking panel without physical stress or abrasion to the hands of the installer during installation and removal of large quantities of blanking panels.

The user may conveniently, comfortably and reliably engage and remove the blanking panel from the equipment rack or cabinet enclosure by grasping the first and second grips regardless of the clearance laterally outward of the ends of the blanking panel and regardless of laterally inwardly projecting rack frame or door structure. This design and mechanism eliminates the problems of discomfort in installing and removing, and of abrading or scraping hands and knuckles.

The stacking structure of the blanking panel allows multiple blanking panels to be stacked in a stable manner without the use of an external support structure, such as a box or the like.

Resiliently flexible sealing skirt members extend along the edges of the blanking panels and form a positive seal with electronic equipment or other blanking panels in mounting locations immediately above and below the blanking panel to prevent air flow therebetween. The sealing blanking panels may be mounted and removed without the need to disassemble and re-assemble adjacent blanking panels or electronic equipment.

Further, the blanking panel provides an off-set platform for mounting instruments to measure the ambient atmospheric conditions, for mounting signage or for a writing surface. Further, the blanking panel may provide a cable pass-through.

BRIEF DESCRIPTION OF THE DRAWINGS

For a complete understanding of the above and other features of the invention, reference shall be made to the following detailed description of the preferred embodiments of the invention and to the accompanying drawings, wherein:

FIG. 2 is a front elevation view of the blanking panel of FIG. 1;

FIG. 3 is a bottom plan view of the blanking panel of FIG. 1;

FIG. 8C is a section view of the blanking panel, showing pliant end portions of the sealing skirt members;

DETAILED DESCRIPTION OF THE INVENTION

Figure 1:
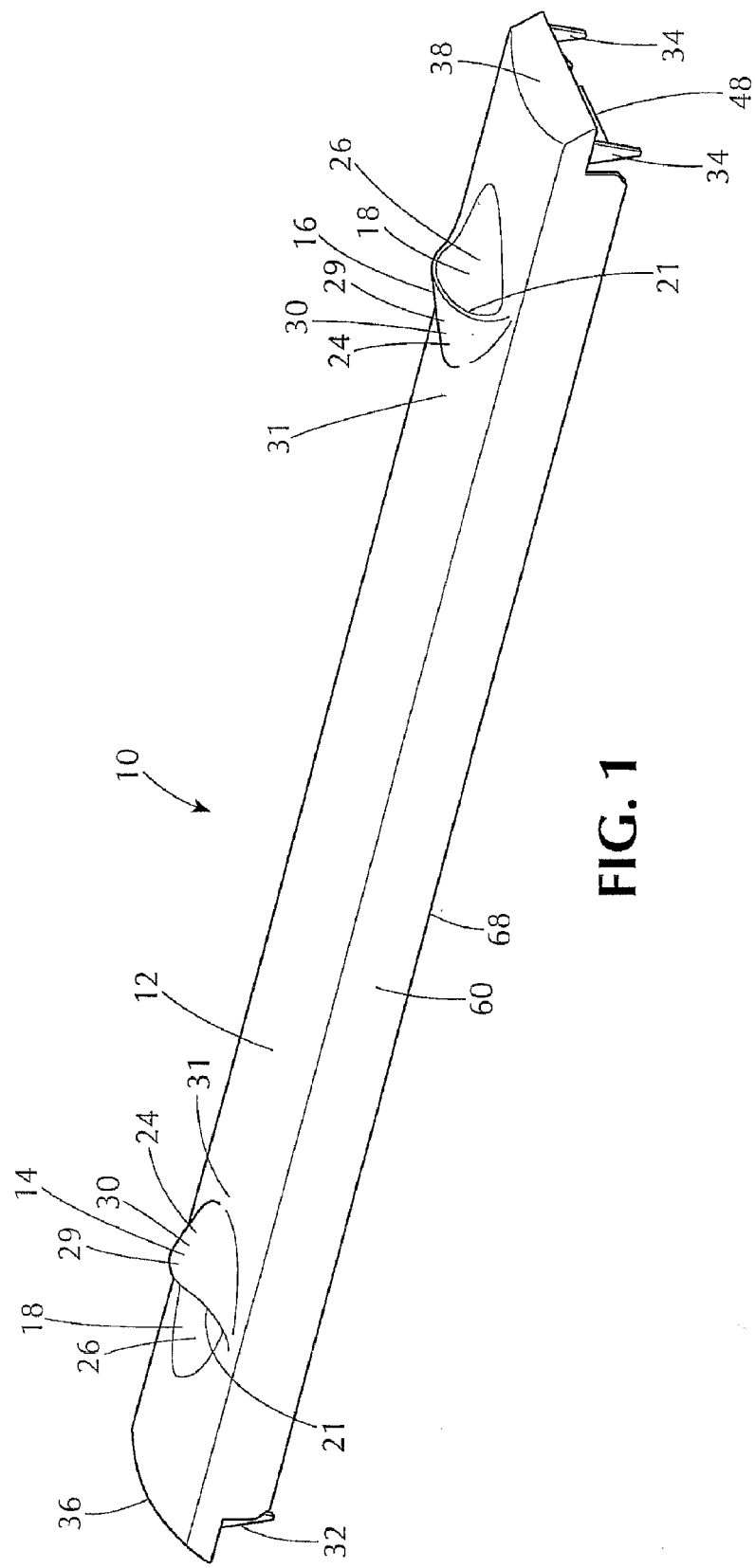
FIG. 1 is a perspective view of a blanking panel constructed according to the invention.
Figure 4A:
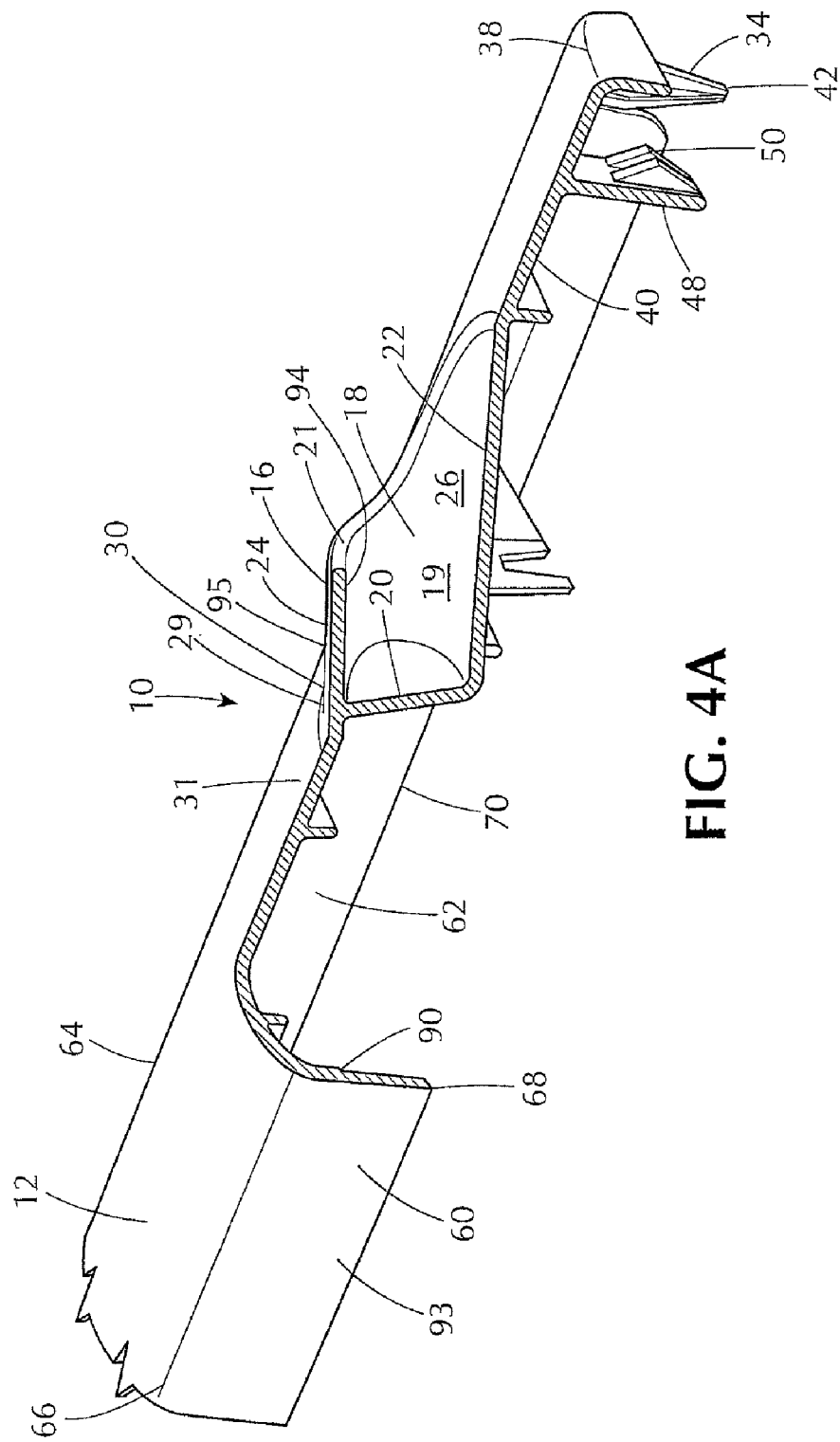
FIG. 4A is a perspective cross sectional view of the blanking panel, taken along line 4A-4A of FIG. 2.
Figure 4B:
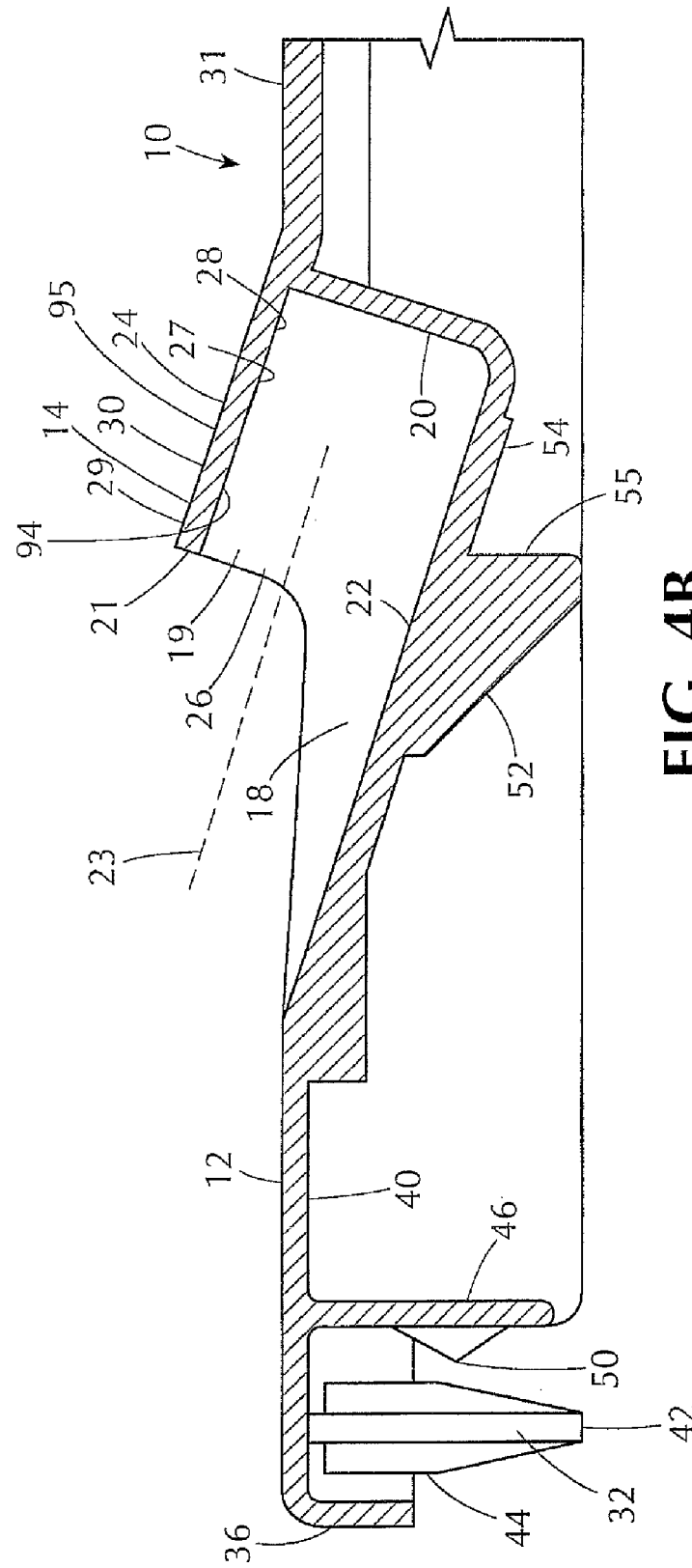
FIG. 4B is a cross sectional view of the blanking panel, taken along line 4B-4B of FIG. 2.
Figure 5:
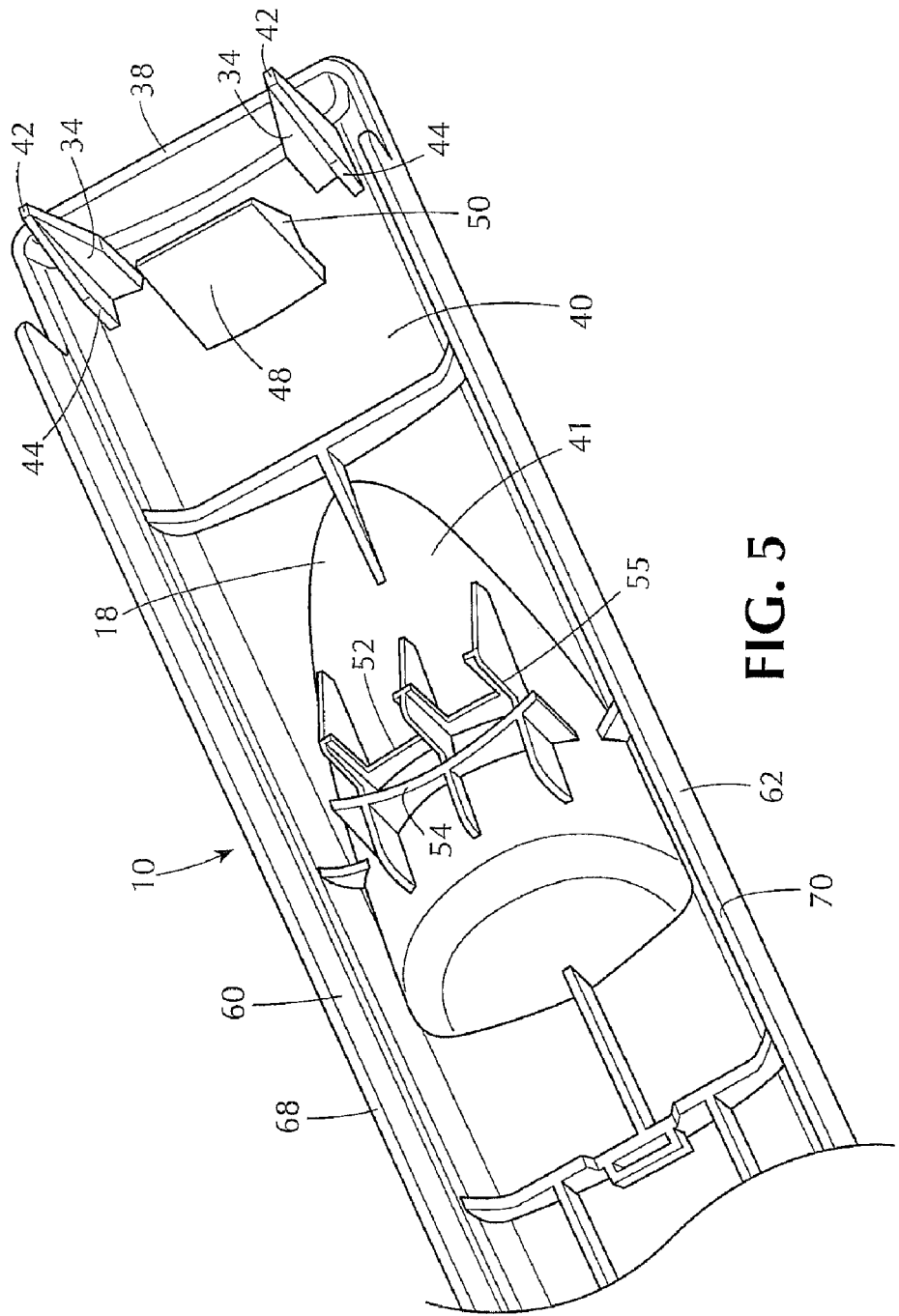
FIG. 5 is a rear perspective view, showing the nested stacking support features of the blanking panel of FIG. 1.

Referring to FIGS. 1-9, a 1 U version of a blanking panel 10 constructed according to the invention includes a pair of ergonomic grips 14, 16 formed in a front wall 12 to facilitate secure, comfortable mounting and removal of the blanking panel 10 from a standardized electronic equipment rack or cabinet enclosure.

The blanking panel 10 has a generally rectangular configuration and is advantageously formed of a unitary molding of structural plastic material, and preferably an ABS plastic material having fire retardant characteristics.

Preferably, the blanking panel 10 has a lateral length, as measured from one end 36 to an opposite end 38, suitable for mounting in a standardized electronic equipment rack or cabinet enclosure, for example about 49 mm (i.e., about 19 inches). The above-mentioned ANSI/EIA-310-E standard specifies acceptable distances of 482.2 mm, 609.6 mm, or 782.2 mm, (i.e., about 19 inches, 24 inches, or 30 inches), with a tolerance of about +/−4 mm. Further, the blanking panel 10 has a height, as measured from a top edge of a front wall 12 to a bottom edge thereof, substantially equal to or slightly less than an integer multiple of a predetermined height unit (U) of the standardized equipment rack or cabinet enclosure (1 U, 2 U, 3 U . . . nU), for example about 44.45 mm, or about 1.75 inches.

The grips 14, 16 are disposed on the front wall 12 of the blanking panel 10, and are operable for mounting and removal of said blanking panel 10 to and from the mounting rails. The grips 14, 16 are accessible from the front wall 12 of the blanking panel 10 when the blanking panel 10 is mounted to the mounting rails with devices (or other blanking panels) occupying mounting locations immediately above and below the blanking panel.

Each grip 14, 16 has a first bearing surface 94 (FIGS. 4A & 4B) sized and shaped to engage a substantial portion of the palmar aspect of a digit of a hand of the user (e.g., a finger or thumb). The first bearing surface 94 is spaced at least about 5 cm (and preferably about 9 cm) from an adjacent end portion 36, 38 of the blanking panel 10, and is operable to receive a pulling force exerted on the blanking panel 10 by the user, for removing the blanking panel from the mounting rails. The first bearing surface 94 faces (at least partially) toward the rear of the blanking panel. In other words, a normal vector of the first bearing surface 94 (or at least a component of a normal vector) points toward the rear of the blanking panel 10, such that a pulling force exerted perpendicular on the first bearing surface by a user will tend to dislodge the blanking panel 10 from the mounting rails. The first bearing surface 94 may have a concave or complex shape, in which case normal vectors (or components thereof) of a substantial portion or majority of the surface face toward the rear of the blanking panel.

Each grip 14, 16 also includes a second bearing surface 95 proximate the first bearing surface 94, which second bearing surface 95 is operable to receive a pushing force for installing the blanking panel 10. The first and second bearing surfaces 94, 95 of each grip 14, 16 are preferably substantially parallel and are engagable between the finger and thumb of a hand of a user for mounting and removal of the blanking panel 10.

Preferably, the first bearing surface 94 forms a finger bearing surface 28 and the second bearing surface 95 forms a thumb bearing surface 30. It is intended that the user engage the finger bearing surface 28 with a finger and likewise, the thumb bearing surface 30 with a thumb. However, it can be appreciated that the reverse may also be possible, or the user may use two fingers from each hand, instead of a finger and thumb. Therefore, as used herein the term "finger bearing surface" shall include suitable for contact by a thumb, and the term "thumb bearing surface" shall include a surface suitable for contact by a finger.

Each grip 14, 16 has a contact member 24 which may be engaged between a finger and thumb of the user for mounting and removal of the blanking panel 10. The first bearing surface 94 and/or finger bearing surface 28 is preferably disposed on an interior portion of the contact member 24. The finger bearing surface 28 is sized to engage a majority of the palmar aspect of the fingertip of the user beyond from at least about the DIP joint of the finger to about the end extremity of the finger, or, alternatively, beyond from at least about a mid-point between the DIP joint to about the end extremity of the finger. Thus, the finger bearing surface 28 preferably has a length (as measured along the finger insertion axis 23) of about 1-4 cm and a width (measured along an axis or arc perpendicular to the finger insertion axis 23) of about 1-2 cm. As depicted, the finger bearing surface 28 is disposed on an interior surface 27 of the contact member 24. The finger bearing surface 28 preferably has a concave shape to comfortably conform to the convex shape of an average adult fingertip. Alternatively, the finger bearing surface 28 may be substantially planar, or another suitable surface shape.

As set forth above, the DIP joint of each finger and thumb interconnects the outermost (i.e., distal) finger/thumb bone (phalanx) to the middle finger/thumb bone and is generally located at the DIP crease—in the palmar aspect (i.e., fingerprint area) of the finger/thumb—between the distal and middle phalanges.

The contact member 24 (and optionally an adjacent portion 31 of the front wall 12) forms the second bearing surface 95 and/or thumb bearing surface 30, which is sized to engage a majority of a palmar aspect of the of the thumb of the user beyond from at least about the DIP joint of the thumb to about the end extremity of the thumb (or, alternatively, beyond from at least about a mid-point between the DIP joint and the end extremity of the thumb). Thus, the thumb bearing surface 30 preferably has a length of about 1-4 cm and a width of about 1-2 cm. As depicted, the thumb bearing surface 30 is disposed on an exterior surface 29 of the contact member 24. The thumb bearing surface 30 may have a convex shape, a substantially planar shape, or another suitable shape.

Each grip 14, 16 also includes a back wall 22, an end wall 20, and an opening 26. The opening 26 is partially defined by a free edge 21 of the contact member 24. The back wall 22 projects rearward from the front wall 12 and laterally inward (i.e., away from the adjacent end 36, 38), and forms a rearward and laterally inwardly projecting, concave recess 18 sized and shaped to, at least partially, receive a finger therein. The contact member 24 extends over the concave recess 18 formed by the back wall 22 and projects, from the front wall 12 to the free edge 21, forwardly and laterally outward, generally toward the adjacent end 36, 38 and parallel to the back wall 22, such that the back wall 22, contact member 24 and end wall 20 form a partially enclosed finger cavity 19 for receipt of a finger therein.

Each finger cavity 19 has a depth sufficient to receive an average adult finger of user up to at least about an outermost joint of the finger (which is the distal interphalangeal—DIP—joint), for example up to about 2-4 cm, without any, or any substantial amount of, compression or pinching of the finger between the back wall 22 and the contact member 24. Thus, the user can preferably insert a finger up to at least a point where the DIP crease contacts the free edge 21 of the contact member 24. Alternately, each grip 14, 16 can be sized to receive the finger up to about a mid-point between the end extremity of the finger and the DIP joint, or a depth of about 1-2 cm.

Suitably, the finger cavity 19 of each grip 14, 16 has an elliptical cross section (as taken in a plane perpendicular to an axis of insertion 23 of the finger into the finger cavity 19) with a long (vertical) axis of about 3 cm and a short (horizontal) axis of about 2 cm. Alternatively, the finger cavity 19 can have a cylindrical cross-section having a diameter of about 2-3 cm, or another suitable cross-sectional configuration.

When mounting or removing the blanking panel 10, it is necessary for the user to apply rearward or forward pressure to the blanking panel 10. The grips 14, 16 provide a comfortable and secure means by which to apply such pressure. To mount or remove the blanking panel 10, a user may securely and comfortably grip the blanking panel 10 by inserting an index finger (or any finger) into the finger cavity 19 of each grip 14, 16 from the front of the blanking panel 10 and gripping the associated contact member 24 between the inserted finger and the associated thumb. Alternatively, the user may employ a different combination of digits such as one or two fingers, or one thumb.

Figure 7A:
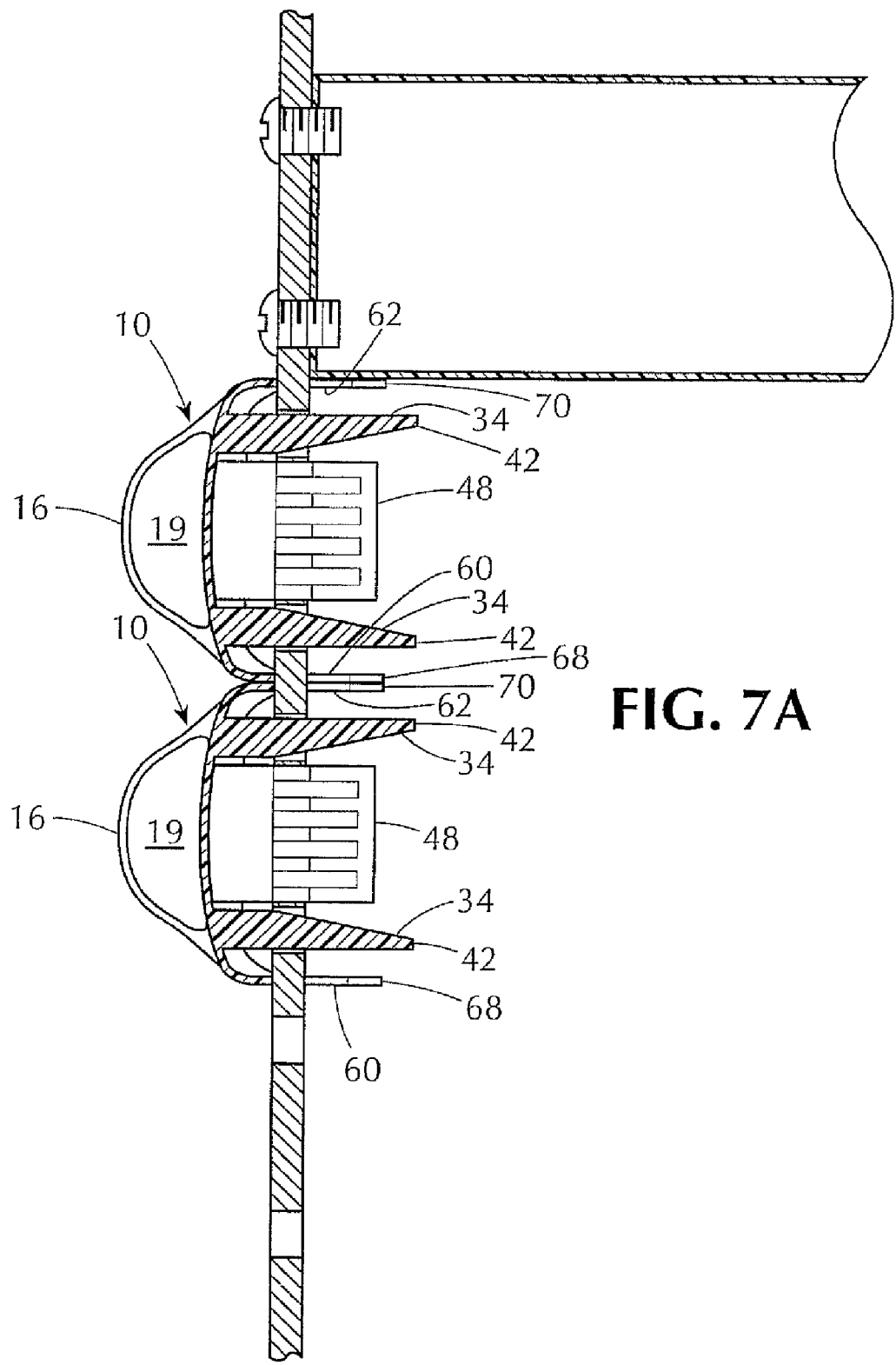
FIG. 7A is a side elevation cross sectional view, showing two blanking panels mounted in a standardized electronic equipment rack.
Figure 7B:
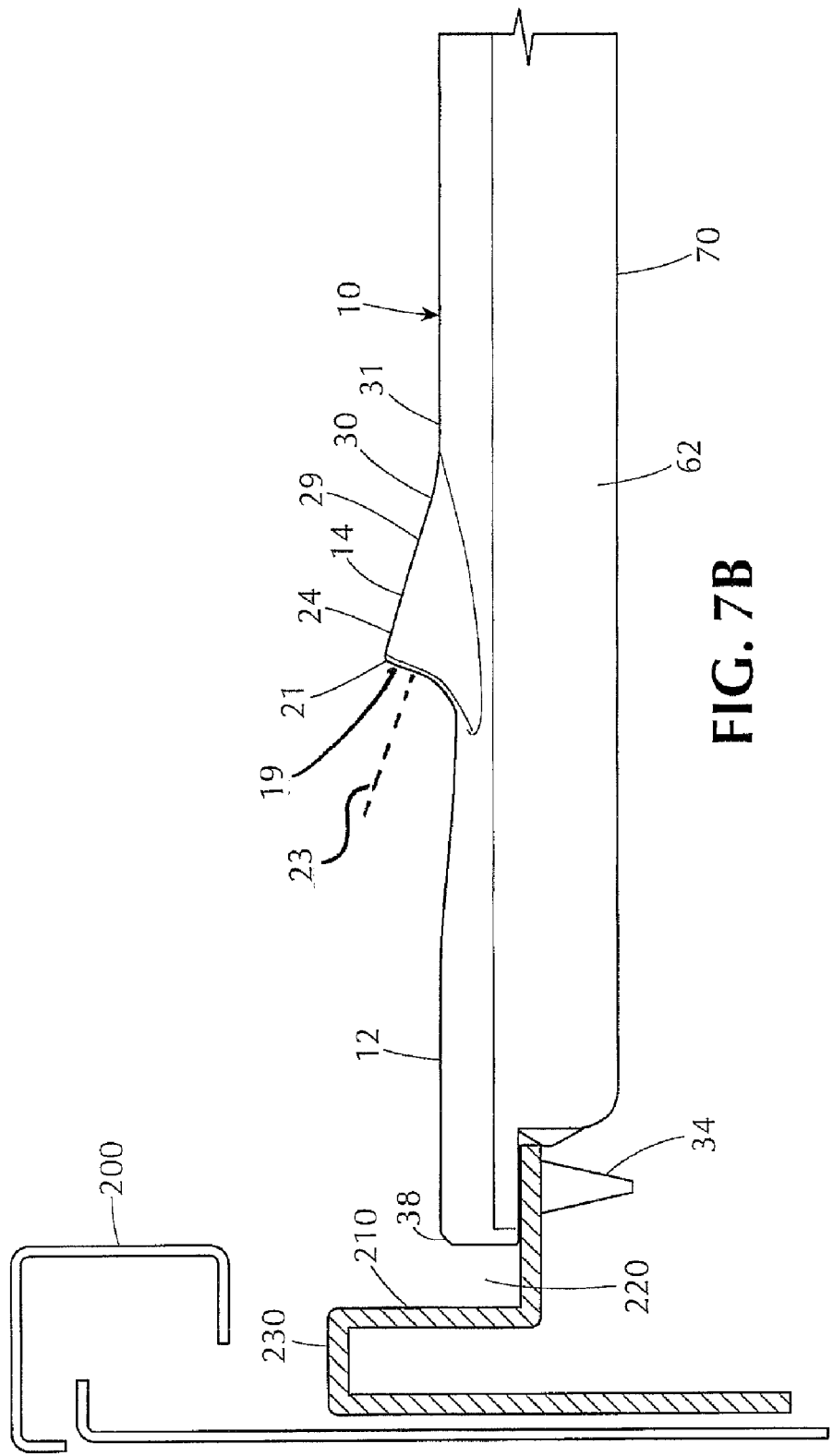
FIGS. 7B & 7C are a top plan view and a perspective view, showing a blanking panel mounted in a standardized electronic equipment rack.
Figure 7C:
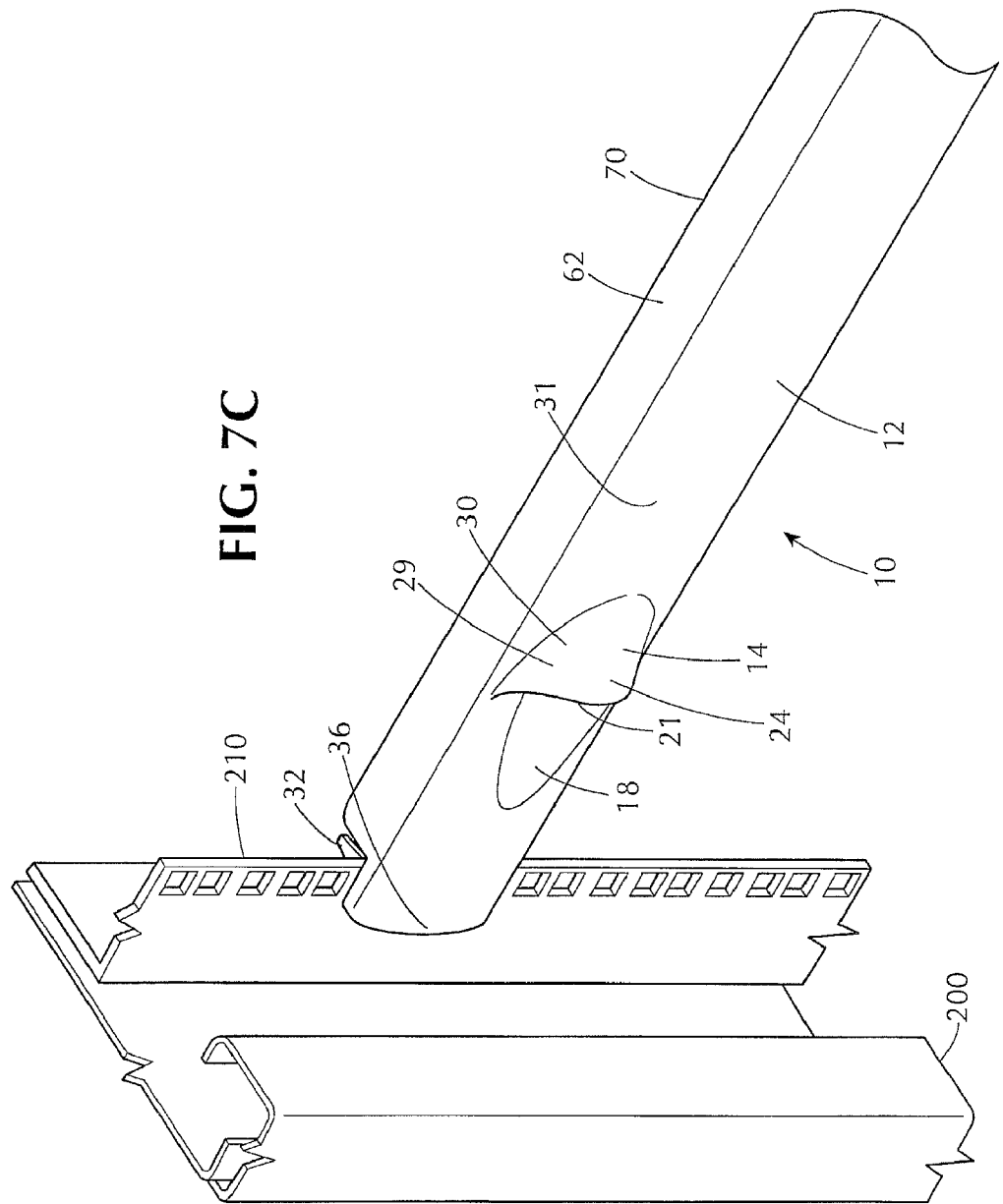

Referring to FIGS. 7B & 7C, standardized equipment racks or cabinet enclosures often have frame and door structure 200 that project laterally inward (about 2-4 cm) with respect to the outer ends 36, 38 of the blanking panel 10, which, with prior blanking panels, requires the user to navigate their hands and fingers inside the frame and then laterally outward to the ends of the prior blanking panel to mount and remove the blanking panel. As depicted in FIG. 7B, the mounting rails 210 of such racks commonly include integral or connected structure which extends forward, laterally outward of the mounting rails, such that a narrow gap 220 of about 1-2 cm (or less) exists between the outer ends 36, 38 of the blanking panel 10 and the forwardly extending portion 230 of the mounting rails. Such structure can substantially hinder or prevent a user from securely and comfortably grasping the ends 36, 38 of the prior blanking panel during mounting and removal. Thus, as can be appreciated, the structure of standardized racks and cabinet enclosures can result in undesirable, and uncomfortable or painful physical stress, abrasion, bumping, scraping or skinning contact of the user's hands or knuckles with the frame and/or mounting rails when attempting to mount or remove a prior blanking panel.

To overcome the above problems, and to provide a secure and comfortable grip, each grip 14, 16, is disposed on the front of the blanking panel 10. Further, each grip 14, 16, or specifically the free edge 21 of the contact member 24 of each grip 14, 16, is disposed laterally inward from an adjacent end 36, 38 of the blanking panel 10 a distance sufficient to allow the user to securely and comfortably grasp the grips 14, 16 while maintaining the users hands and forearms between the ends 36, 38 of the blanking panel 10 and between the frame and door structure of the rack. Specifically, the grips 14, 16 (or more specifically, the free edges 21 of the contact members 24) may be located laterally inward from the associated adjacent end 36, 38 of the blanking panel 10 at least about 5-15 cm, and preferably about 9 cm. With this configuration, the blanking panel 10 may be comfortably and securely mounted and removed in a rack or cabinet enclosure having limited or no clearance laterally outward of the ends 36, 38 of the blanking panel 10, and/or a rack having laterally inwardly projecting frame or door structure, without any contact of the user's hands with the rails or cabinet enclosure. Further, the grips 14, 16 are preferably arranged symmetrically along a lateral axis of the blanking panel 10.

To ensure proper alignment during mounting, the blanking panel 10 includes two pairs of rail alignment projections 32, 34, each pair being located adjacent one of the opposed ends 36, 38 of the blanking panel 10. The rail alignment projections 32, 34 extend from a rear surface 40 of the front wall 12 and are sized, shaped and spaced to align with and fit within holes in opposed mounting rails of the standardized rack. Each rail alignment projection 32, 34 is preferably tapered, such that an end extremity 42 has a smaller cross-section than a base portion 44 to facilitate such alignment. Other suitable shapes or configurations of the alignment projections are also within the scope of the invention.

Preferably, the rail alignment projections 32, 34 are sized and shaped to prevent any substantial movement of the blanking panel 10 when mounted, so as to maintain a proper seal provided by the blanking panel. Preferably, the mounted blanking panel 10 will move no more than about 0.005 inches to about 0.030 inches, and preferably no more than about 0.020 inches in either the horizontal (lateral) or vertical direction.

The blanking panel 10 also includes a pair of snap-mount or friction-fit rail engagement members 46, 48 located laterally inward of the rail alignment projections 32, 34. The rail engagement members 46, 48 extend from the rear surface 40 of the front wall 12. Each rail engagement member 46, 48 is resiliently cantilevered from the rear surface 40 of the front wall 12 and includes a laterally outward projecting apex 50 which engages a laterally inward facing surface of an associated mounting rail to secure the blanking panel 10 to the rack.

Preferably, the rail alignment projections 32, 34 extend from the rear surface 40 of the front wall 12 a distance greater than the rail engagement members 46, 48 such that the rail alignment projections 32, 34 enter the holes in the mounting rails prior to engagement of the rail engaging members 46, 48 with the mounting rails, so that the user may, during the initial process of mounting, reliably obtain a proper alignment of the blanking panel 10 with the rack and may, in the final process of mounting, maintain such proper alignment while applying mounting pressure to mount the blanking panel 10.

Referring to FIGS. 4A-6, the blanking panel 10 is configured for stacking of multiple blanking panels during shipping and storage. A pair of stacking supports 52 is located between skirt members 60, 62 (described in detail below, and depicted in FIGS. 7A-8), which skirt members have end extremities 68, 70 that extend along substantially the entire length of the blanking panel 10. The stacking supports 52 extend from the rear surface 40 of the front wall 12 or from the back wall 22 of the grips 14, 16 between the skirt members 60, 62. When stacked, the stacking supports 52 and/or the rail alignment projections 32, 34 of an upper blanking panel contact the front wall 12 and/or the contact members 24 of the immediately lower blanking panel to orient and stabilize the upper blanking panel on top of the lower blanking panel.

To stack the blanking panels 10 in a stable manner, a lower blanking panel can be placed face-up (i.e., front wall 12 up) on a horizontal support surface, such as a horizontal floor, table surface or shelf, resting on the skirt members 60, 62 and/or the end extremities 42 of the rail alignment projections 32, 34. In this orientation, a lateral (i.e., end-to-end) axis of the lower blanking panel is substantially parallel to the support surface and is therefore substantially horizontal (this lateral axis may be considered an X axis). Then, an upper blanking panel may be placed face-up on top of the lower blanking panel. When properly stacked, the stacking supports 52 and/or the end extremities 42 of the rail alignment projections 32, 34 of the upper blanking panel support the upper blanking panel with a lateral (X) axis thereof substantially parallel to the corresponding X axis of the lower blanking panel (i.e., substantially horizontal). Further, the stacking supports 52 positively orient the upper blanking panel along the lateral (X) axis relative to the lower blanking panel, with the end portions 36, 38 of the upper and lower blanking panels in substantial vertical alignment (i.e., the upper blanking panel directly above the lower blanking panel). Moreover, the stacking supports 52 prevent relative movement (i.e., translation) between the upper and lower blanking panels along the X axis, such that the ends of the upper and lower blanking panels remain in substantial alignment. The stacking supports 52 and/or the end extremities 42 of the rail alignment projections 32, 34 also orient the upper blanking panel along a horizontal axis perpendicular to the X axis (this may be considered a Y axis), and limit or prevent relative movement of the upper and lower blanking panels along the Y axis.

Additional blanking panels may be stacked on top of the above-described two-piece stack in a likewise manner. The stacking supports of the additional blanking panels restrict movement of the additional blanking panels with respect to the stack below. It has been found that the stacking support arrangement of the invention, which restricts movement of the blanking panels in the two orthogonal horizontal axes (i.e., the X and Y axes) enables the stacking of about 10 pieces of 1 U blanking panels of the present invention in a stable manner, or about 25 pieces of 2 U versions thereof, without the need for additional support from a container or other fixture or device. Further, it is possible to create stable stacks of blanking panels of various sizes. For example 2-1 U pieces may be stacked on top of (or below) a single 2 U piece, and 2-1 U pieces and a 2 U piece could be stacked on top of (or below) a 4 U piece, etc. It can be appreciated that many other stack configurations are also possible.

While the face-up stacking method described above is preferable for stacking blanking panels depicted in FIGS. 1-9, it is within the scope of the invention to stack blanking panels in a face-down orientation, if the front of the blanking panel is flat or is otherwise configured to support the blanking panel on a horizontal support surface with the X and Y axes substantially horizontal. This is particularly true for blanking panels of 2 U size or greater since the apexes of the free edges 21 of the contact members 24 of multi-U versions of the blanking panel provide well-spaced and stable contact points on the support surface.

Each stacking support 52 preferably includes a first portion 54 positioned and shaped to engage the contact member 24 of the lower blanking panel. The first portion 54 may extend from the rear surface 41 of the back wall 22 a set-off distance sufficient to prevent contact of the rail alignment projections 32, 34 of the upper blanking panel with the front wall 12 of the lower panel, such that, when stacked, the upper blanking panel rests on the nested stacking supports 52. The first portion 54 preferably has a concave shape complimentary to the convex shape of the exterior surface 29 of the contact member 24, to properly align and stabilize the upper blanking panel with the lower blanking panel, along the Y axis, perpendicular to the lateral (X) axis of the blanking panel.

Alternatively, the first portion 54 of each stacking support 52 and the rail alignment projections 32, 34 of the upper blanking panel may contact the lower blanking panel when stacked. As a further alternative, the rail alignment projections 32, 34 may extend from the rear surface 40 of the front wall 12 a distance sufficient to prevent contact of the first portion 54 of each stacking support 52 with the lower blanking panel such that the upper blanking panel rests on the rail alignment projections 32, 34. In this further alternative, the first portion 54 of each stacking support 52 preferably closely surrounds the associated contact member 24 to align and stabilize the upper blanking panel with respect to the lower blanking panel.

Each stacking support 52 also preferably includes a second portion 55, located laterally inward of the first portion 54, which second portion 55 extends further from the rear surface 41 of the back wall 22 than the first portion 54. The second portion 55 is positioned to extend into the finger cavity 19 of a lower, stacked blanking panel, immediately adjacent the free edge 21 of the contact member 24, to align and stabilize the upper blanking panel with the lower blanking panel, along the lateral (X) axis.

Stacking stability of the blanking panels 10 is further enhanced by the fact that the curvatures of the contact members 24 and the front wall 12 are non-concentric. Thus, the upper blanking panel 10 is inhibited from rotating (about the X axis) with respect to the lower blanking panel 10. Specifically, two contact areas of the front wall 12 of the lower blanking panel 10 contacted by the end extremities 42 of the rail alignment projections 32, 34 of the upper blanking panel 10 are preferably convex in shape. Further, the areas of the contact members 24 contacted by (or immediately below) the first portions 54 of the stacking supports 52 of the upper blanking panel 10 are also preferably convex in shape. However, the contact members 24 have a radius of curvature substantially smaller than the radius of curvature of the contact areas of the front wall 12. Further, the contact areas of the front wall 12 have centers of curvature substantially displaced from centers of curvature of the areas of the contact members 24 contacted by (or immediately below) the first portions 54 of the stacking supports 52. Preferably, the centers of curvature of the areas of the contact members 24 contacted by the first portions 54 of the stacking supports 52 lie somewhere between the associated contact member 24 and a plane defined by the end extremities 68, 70 of the skirt members 60, 62 (described in detail below), whereas such plane is between the centers of curvature of the contact areas of the front wall 12 and the contact members 24. Since the centers of curvature are non-concentric, the upper blanking panel 10 is inhibited from rotating about the X axis with respect to the lower blanking panel, which imparts significant stability to a vertical stack of blanking panels.

Referring to FIG. 7A-8A, to prevent the flow of air between the blanking panel 10 and other conforming devices (i.e., electronic devices or blanking panels) immediately above and below, the blanking panel 10 preferably includes bottom and top rearwardly projecting skirt members 60, 62 which extend along substantially the entire lateral length of the blanking panel 10. Preferably, each skirt member 60, 62 has a lateral length sufficient to extend substantially entirely between the mounting rails of the rack or cabinet enclosure for which it is designed.

The top and bottom skirt members 60, 62 are resiliently flexible and project divergently rearward from top and bottom edges 64, 66 of the blanking panel 10, respectively. The height of the front of the blanking panel (including any upper and lower edges 64, 66 thereof) is substantially equal to or slightly less than one of the standardized heights of the rack or cabinet enclosure (e.g., 1 U, 2 U, 3 U, . . . nU, less about 0.040 inches). However, the outer edges 97, 98 of the end extremities 68, 70 of the skirt members 60, 62 are preferably spaced apart a predetermined distance greater than the standardized height of the blanking panel 10 such that the skirt members 60, 62 make resilient contact with, and sealingly interfere with another conforming device immediately above or below the blanking panel 10, to substantially prevent air flow therebetween, while permitting smooth mounting and removal of the blanking panel 10 from the rack or cabinet enclosure.

Preferably, the outer edges 97, 98 of the end extremities 68, 70 of the skirt members 60, 62 are spaced apart about 0.040 to about 0.080 inches (most preferably about 0.065 inches) greater than an integer multiple of the standard height of the rack or cabinet enclosure (e.g., nU+about 0.065 inches), which ensures a substantial sealing interference (of about 0.020 to about 0.040 inches, and preferably about 0.033 inches) with adjacent conforming devices, prior blanking panels, and sealing blanking panels (constructed according to the present invention), while accommodating expected manufacturing variances in each skirt member 60, 62. For example, if the blanking panel is of a 1 U size and 1 U is equal to about 1.75 inches, the outer edges 97, 98 may be spaced about 1.82 inches apart.

Preferably, mid points between the outer and inner edges 97, 97' and 98, 98' of the end extremities 68, 70 are spaced apart a distance substantially equal to the standard height of the blanking panel 10 (e.g., 1 U, 2 U, etc.). Therefore, as described above, the outer edges 97, 98 of the end extremities are spaced a predetermined distance apart greater than the standard height of the blanking panel 10, creating an interference of about half the thickness of the end extremity 68, 70 with an adjacent standard-height device or blanking panel to provide sealing interference between the blanking panel 10 and the adjacent devices (or other blanking panels).

As can be appreciated, the interference between two adjacent sealing blanking panels 10 constructed according to the present invention will be double that of the interference between one sealing blanking panel 10 and a standard-height device or a prior blanking panel. However, the resilient flexibility of the skirt members 60, 62 of the two adjacent sealing blanking panels 10 is sufficient to permit smooth mounting and removal of each sealing blanking panel 10.

Figure 8B:
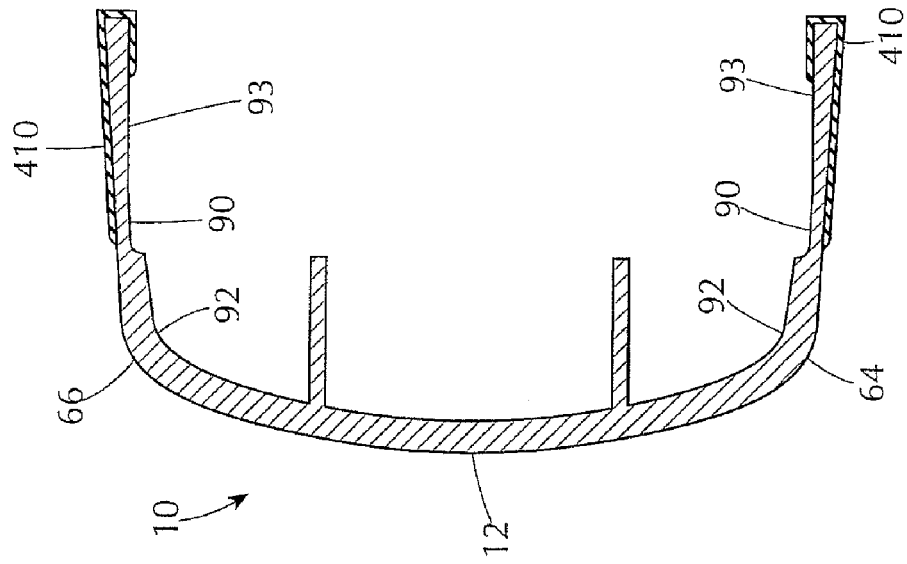
FIG. 8B is a section view of the blanking panel, showing a pliant over-mold.
Figure 8A:
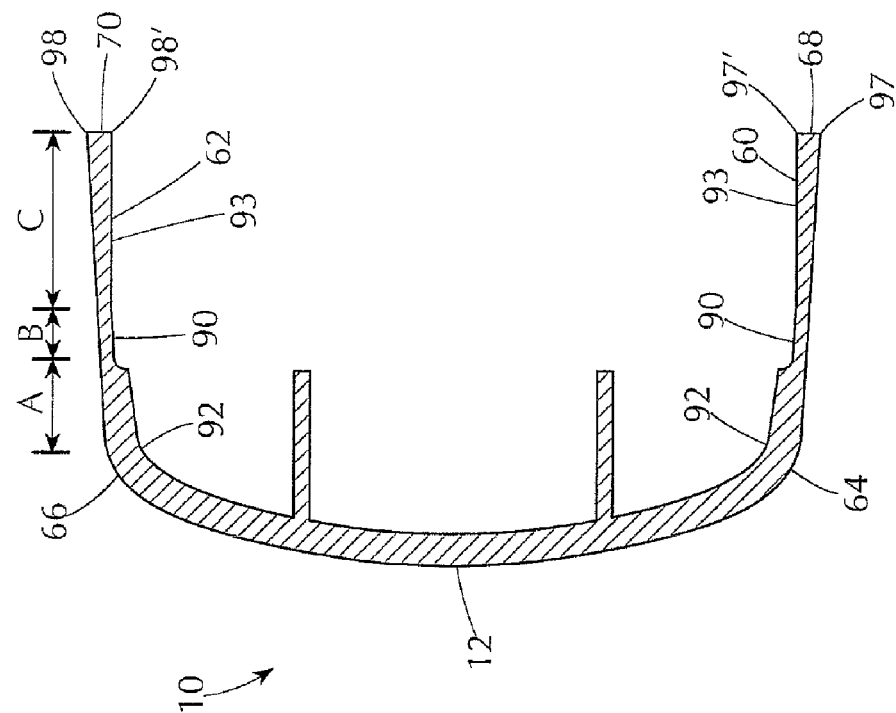
FIG. 8A is a section view of the blanking panel of FIG. 1, showing the cross section of the skirt members.

Referring to FIG. 8A, each skirt member 60, 62 has a living hinge creating an area of flexure 90 disposed between the associated bottom or top edge 64, 66 of the front of the blanking panel 10 and the associated end extremity 68, 70 of the skirt member 60, 62. Each area of flexure 90 has a relatively reduced, and preferably substantially constant, thickness of about 0.025 to about 0.040 inches, most preferably about 0.030 inches, which area of flexure 90 extends rearward about 0.100 to about 0.200 inches, most preferably about 0.150 inches. The area of flexure 90 provides a fatigue-resistant area about which the skirt member 60, 62 resiliently flexes when engaging an adjacent blanking panel or electronic device in the rack or cabinet enclosure.

Each skirt member 60, 62 preferably has a forward area (A) 92 extending from an associated bottom or top edge 64, 66 to the area of flexure (B) 90, which forward area 92 has a relatively increased thickness of about 1.8 to about 2.3 mm. Each skirt member 60, 62 also has a rearward area (C) 93 extending from the area of flexure (B) 90 to the associated end extremity 68, 70 of the skirt member 60, 62, which rearward area 93 has a gradually increasing thickness, from about 0.6 mm to about 1.2 mm adjacent the area of flexure 90, to about 1.3 mm to about 1.8 mm (about 0.060 inches) at the end extremity 68, 70.

As can be appreciated, the seal provided by the skirt members 60, 62 does not require the user to disassemble any adjacent electronic components or blanking panels. The blanking panel 10 is simply inserted into the rack or cabinet enclosure in the open mounting location between the adjacent devices. The resilient skirt members 60, 62 compress upon engagement with the adjacent devices providing a seal therebetween. Likewise, no disassembly of the adjacent devices is required to remove the blanking panel.

Referring to FIG. 8B, to further aid in sealing, the skirt members 60, 62, or at least an outer surface thereof, may include an over-mold of a relatively pliant material 410, such as a natural or synthetic rubber, or an elastomer thermoplastic such as a polyolefin, fluoropolymer, vinyl, or a like material having a Shore A Durometer reading of about 50 to about 180. Preferably, the over-mold has a thickness of about 0.020 to about 0.060 inches and is substantially more pliant than the material comprising the remainder of the blanking panel.

Referring to FIG. 8C, end portions 568, 570 of the skirt members 60, 62 of the blanking panel 10 may be constructed of a pliant material 510 (as described in reference to FIG. 8B above), which is joined to (harder, less pliant) base portions 590 of the associated skirt member by an overmold 520, which overmold may be at an approximate midpoint of the skirt member 60, 62, or may be adjacent to (or slightly rearwardly of) the bottom and top edges 64, 66. Preferably, the pliant material of the skirt members 60, 62 has a thickness of about 0.015 inches to about 0.125 inches, and most preferably about 0.060 inches.

As above, the end extremities 68, 70 of the skirt members 60, 62 are spaced apart about 0.040 to about 0.080 inches (most preferably about 0.065 inches) greater than an integer multiple of the standard height of the rack or cabinet enclosure (e.g., nU+about 0.065 inches). Further, the pliant end portions 568, 570 of the skirt members 60, 62 preferably have an arcuate cross section (perpendicular to the lateral, X axis) which is concave in the upward direction for the top skirt 62 and in the downward direction for the bottom skirt 60, such that the pliant end portions diverge in a rearward direction. The arcuate configuration and pliant material of the end portions 568, 570 provide enhanced sealing between the blanking panel and an adjacent conforming device. Preferably, the configuration provides sealing contact between the skirts and an adjacent compliant device along an area having a front-to-back dimension of about 0.010 inches to about 0.115 inches, and most preferably about 0.10 inches. This area may be defined in part by the end extremities 68, 70 of the skirt members 60, 62 and by at least the associated overmold 520. Thus, the sealing between the blanking panel and an adjacent device occurs over a band or region, which creates a substantial and highly effective seal.

Figure 9:
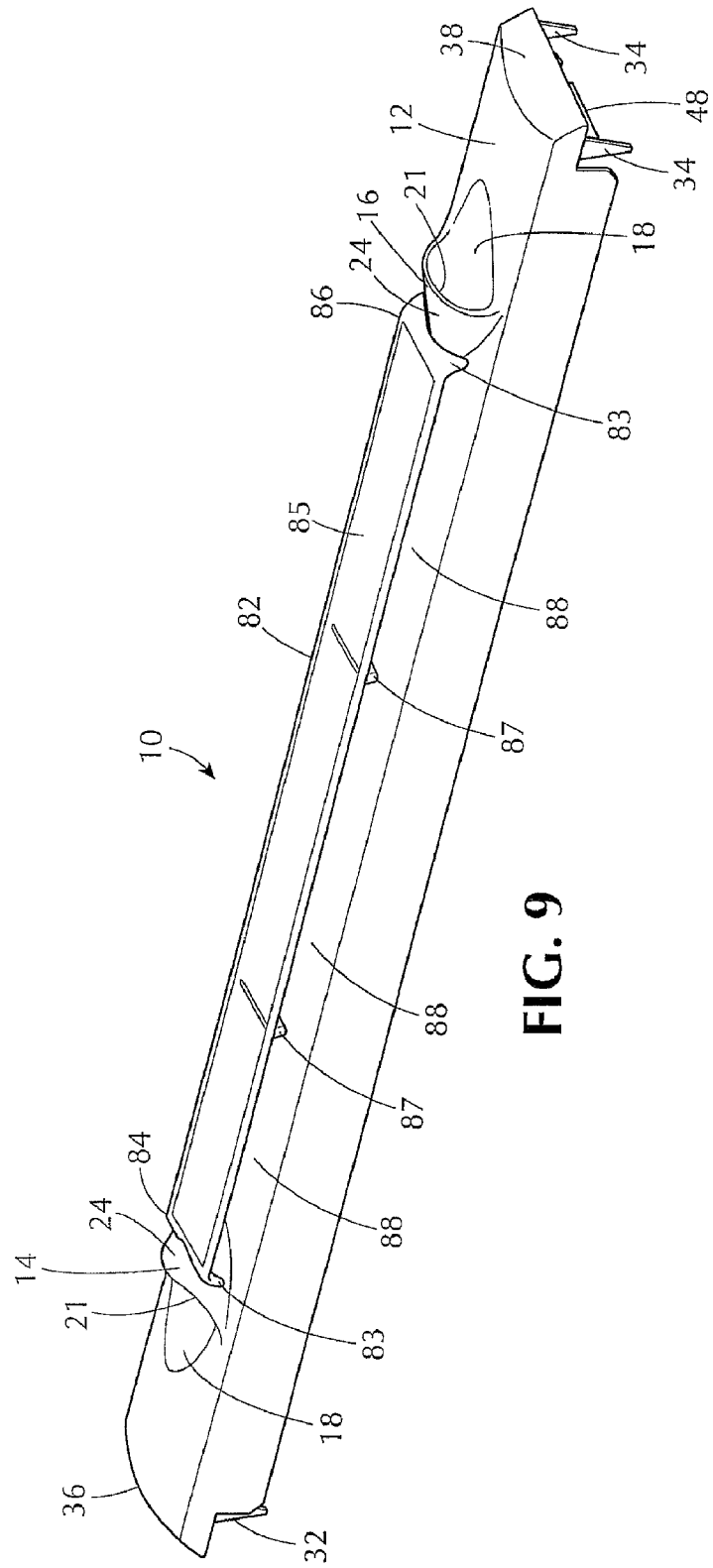
FIG. 9 is a perspective view of a blanking panel constructed according to the invention having an off-set platform mounted to a front wall of the blanking panel.
Figure 10:
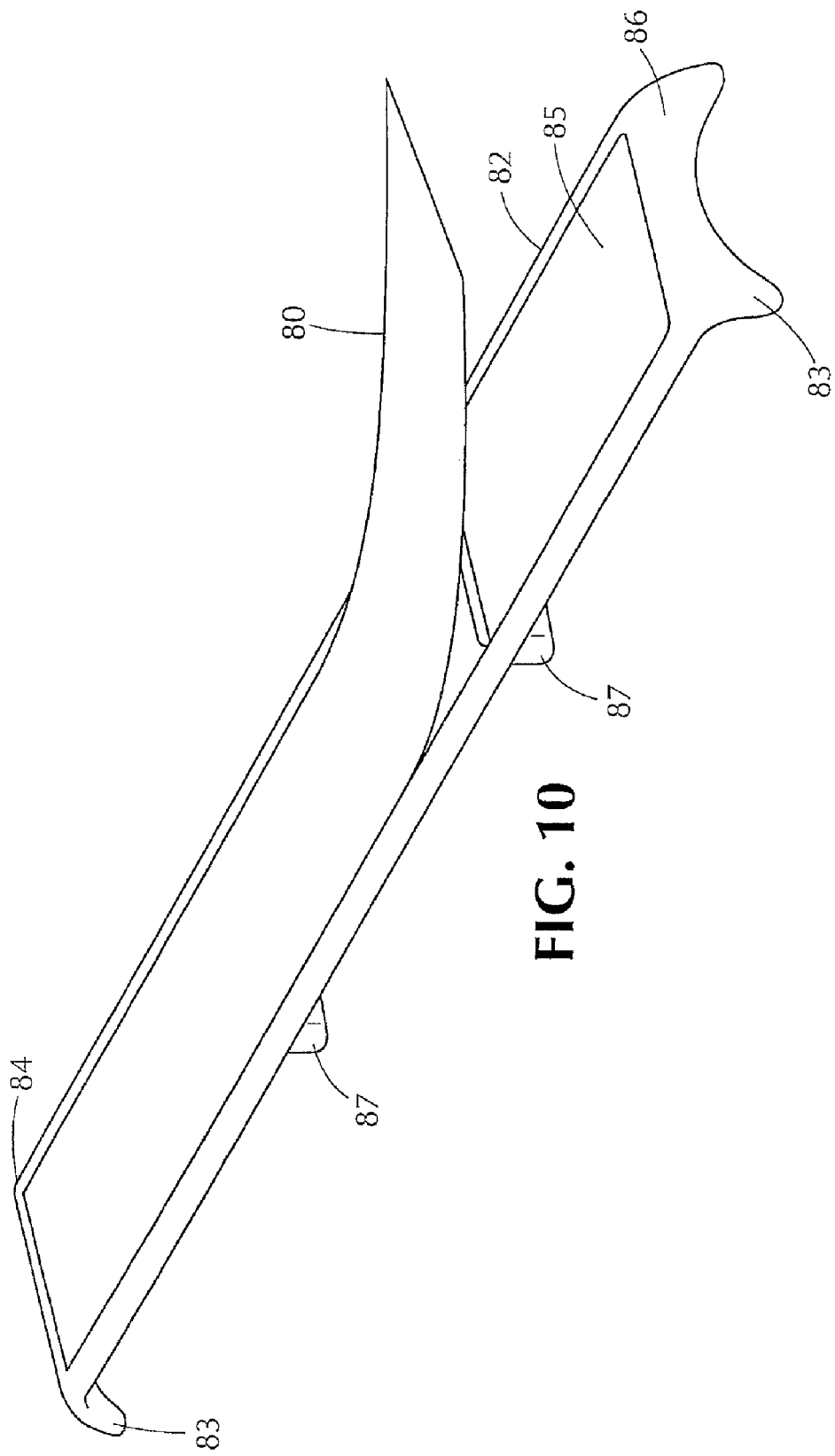
FIG. 10 is a perspective view of the off-set platform of FIG. 9.

Referring to FIGS. 9-10, the blanking panel 10 may optionally include an ambient air temperature indicating strip 80, such as a liquid-crystal display (LCD) temperature indicating strip, affixed to a mounting surface 85 of an off-set platform 82 mounted to the front wall 12 and/or contact members 24 of the blanking panel 10. Suitably, the off-set platform may have a lateral end-to-end length of about 263 mm to about 275 mm, and preferably about 270 mm.

The off-set platform 82 is preferably connected to the front wall 12 by a pair of end connectors 83, and by a plurality of (e.g., two) intermediate connectors 87, which are located at intervals between the end connectors 83. The off-set platform 82 is set off a predetermined off-set distance from the front wall 12 (e.g., about 5 mm to about 7 mm) along a majority of a lateral length thereof, such that there exists an elongated air-flow passage or passages 88 between the off-set platform 82 and the front wall 12 of the blanking panel 10. The off-set distance prevents any (or any substantial amount of) conductive heat transfer between the front wall 12 and the mounting surface 85 of the off-set platform 82. Further, the air-flow passage(s) 88 permit ambient air to flow between the front wall 12 of the blanking panel 10 and the off-set platform 82, such that the effect of any radiative or convective heating of the off-set platform 82 by the front wall 12 of the blanking panel 10 is virtually eliminated. Thus, the temperature of the mounting surface 85 most closely indicates the temperature of the ambient air, as opposed to the temperature of the front wall 12 of the blanking panel 10, which may be influenced by the temperature of the equipment rack, the cabinet enclosure or the air therewithin. Therefore, a temperature indicating strip 80 affixed to the mounting surface 85 will accurately display the temperature of the ambient air.

Figure 6:
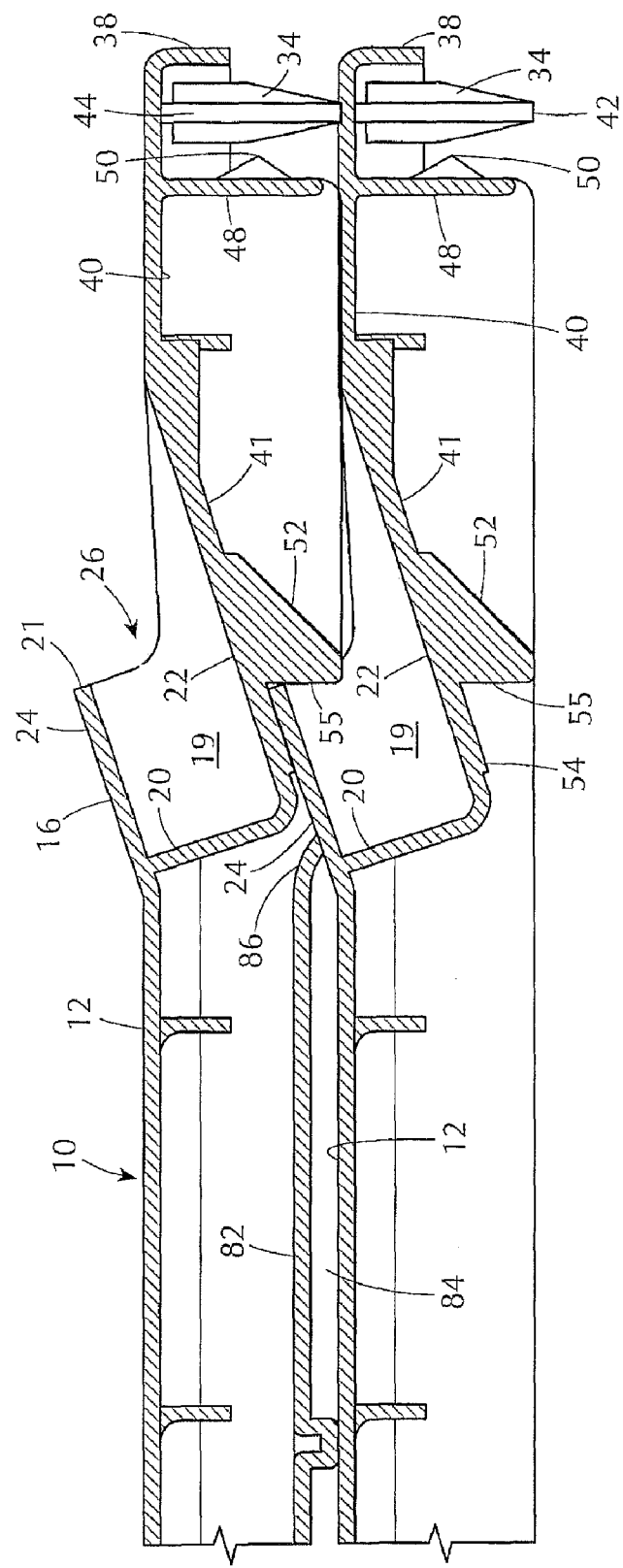
FIG. 6 is cross sectional view, showing nested stacking of two blanking panels constructed according to the invention.

Referring to FIG. 6, preferably, when upper and lower blanking panels 10 are stacked, extreme lateral ends 84, 86 of the off-set platform 82 of the lower blanking panel 10 are located intermediate points at which the stacking supports 52 of the upper blanking panel 10 contact the lower blanking panel such that the off-set platform 82 does not interfere with or prevent nested stacking of the blanking panels 10.

In addition to or instead of the air temperature indicating strip 80, the blanking panel 10 can include a variety of other devices mounted to or within the front wall 12, such as, for example, a writing surface, signage, a humidity indicator, an electronic display or a pair of opposed, elongated brushes, elastomer, sponges, or other material for permitting the passage of cables therethrough, while simultaneously controlling air flow through the blanking panel 10. If the blanking panel 10 includes such a cable pass-through, both the front wall 12 and the off-set platform 82 preferably have a cable pass-through to guide the cables through the blanking panel 10.

Figure 11:
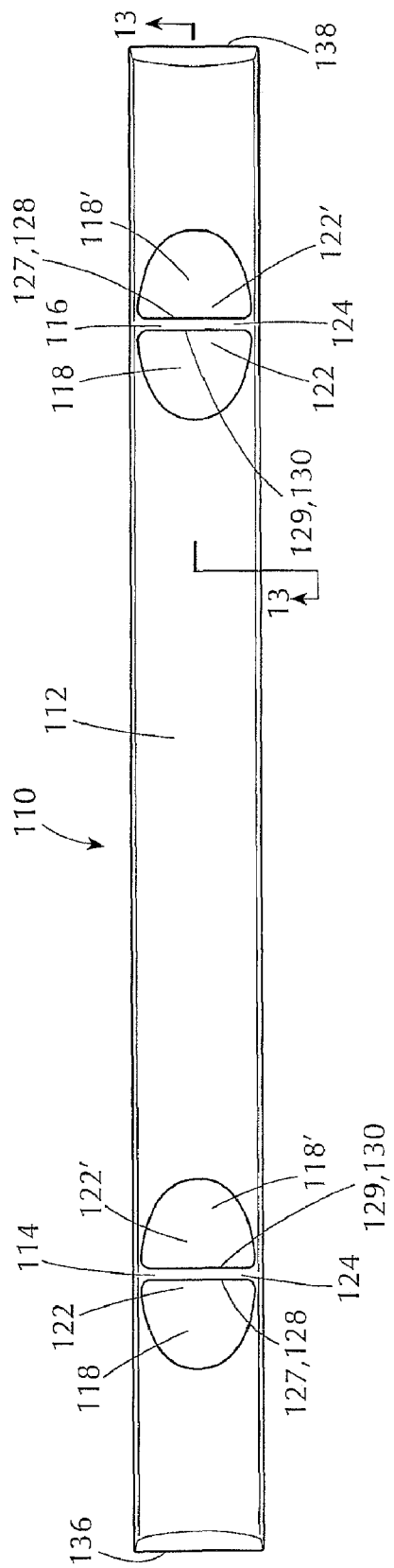
FIG. 11 is a front elevation view of a second embodiment of the blanking panel.
Figure 12:
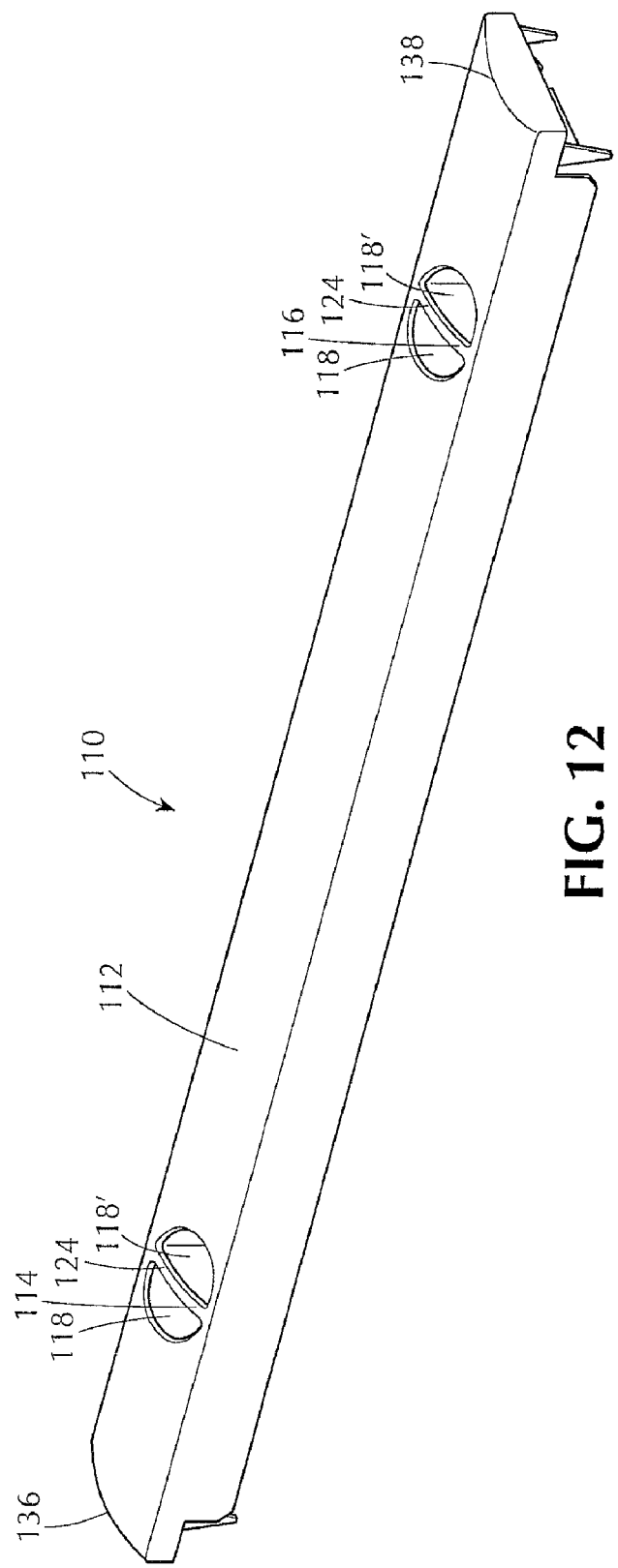
FIG. 12 is a perspective view of the blanking panel of FIG. 11.
Figure 13:
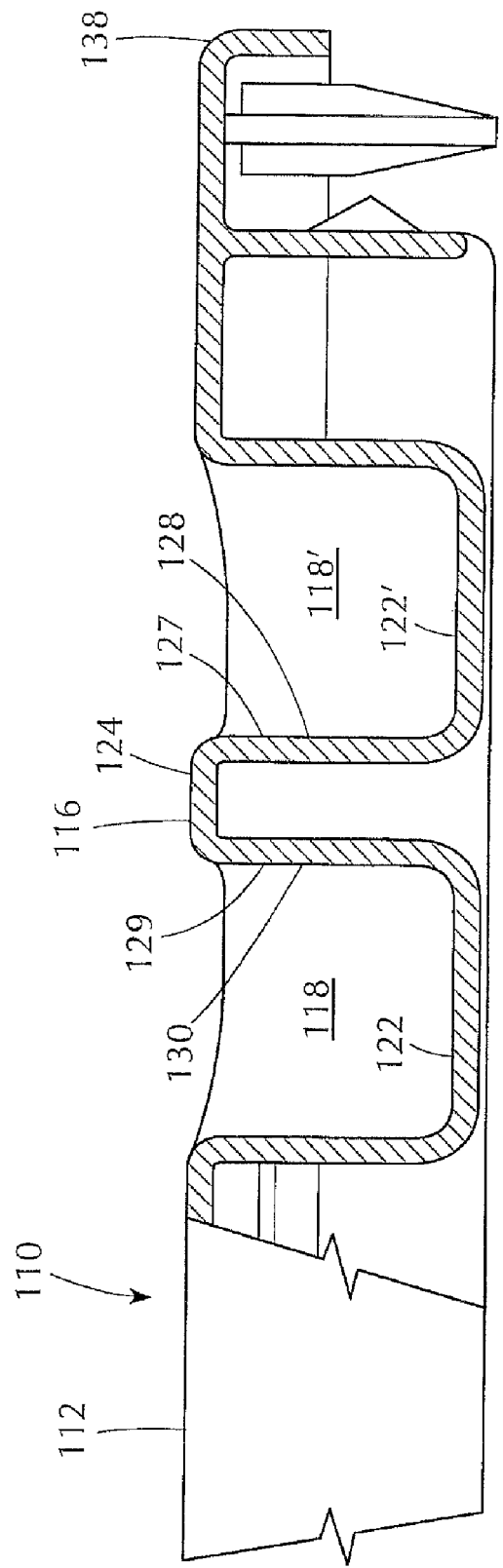
FIG. 13 is a partial cross sectional view, taken along line 13-13 of FIG. 1.

Referring to FIGS. 11-13, an alternative embodiment of the blanking panel 110 has grips 114, 116 comprising an adjacent pair of recesses 118, 118' formed in and projecting rearward from the front wall 112 of the blanking panel 110. Each recess 118, 118' is sized and shaped to receive a finger or thumb of a user therein. Preferably, the recesses 118, 118' are substantially D-shaped and reverse D-shaped (as viewed from the front), and are disposed in an adjacent, mirrored arrangement, such that the straight (vertical) lines of the two D's closely abut one another.

A contact member 124 is disposed between each pair of recesses 118, 118'. The contact member 124 preferably extends from a bottom 122, 122' of each recess 118, 118' substantially to a plane of the front wall 112 of the blanking panel 110. Each contact member 124 includes a laterally outward surface 127, which forms a finger bearing surface 128, and a laterally inward surface 129, which forms a thumb bearing surface 130.

As described above, each finger bearing surface 128 is sized to engage a majority of the palmar aspect of the fingertip of the user beyond from about the DIP joint of the finger to about the end extremity of the finger, or, alternatively, beyond from about a mid-point between the DIP joint to about the end extremity of the finger. The thumb bearing surface 130 is sized to engage a majority of a palmar aspect of the thumb of the user beyond from about the DIP joint of the thumb to about the end extremity of the thumb, or, alternatively, beyond from about a mid-point between the DIP joint and the end extremity of the thumb.

The finger and thumb bearing surfaces 128, 130 may be substantially planar, and substantially parallel. Alternatively, the finger and thumb bearing surfaces 128, 130 may diverge in a forward direction (i.e., from the bottom 122, 122' of the recesses 118, 118' toward the front wall 112), to provide an enhanced grip between the finger and thumb.

Also as described above, each grip 114, 116, or the contact member 124 of each grip 114, 116, is preferably disposed laterally inward from an associated end 136, 138 of the blanking panel 110 at least about 5-15 cm, and preferably about 10 cm, such that a user may securely and comfortably grasp the grips 114, 116 while maintaining the users hands and forearms between the ends 136, 138 of the blanking panel 110. Further, the grips 114, 116 are preferably arranged symmetrically along a lateral axis of the blanking panel 110.

Figure 14:
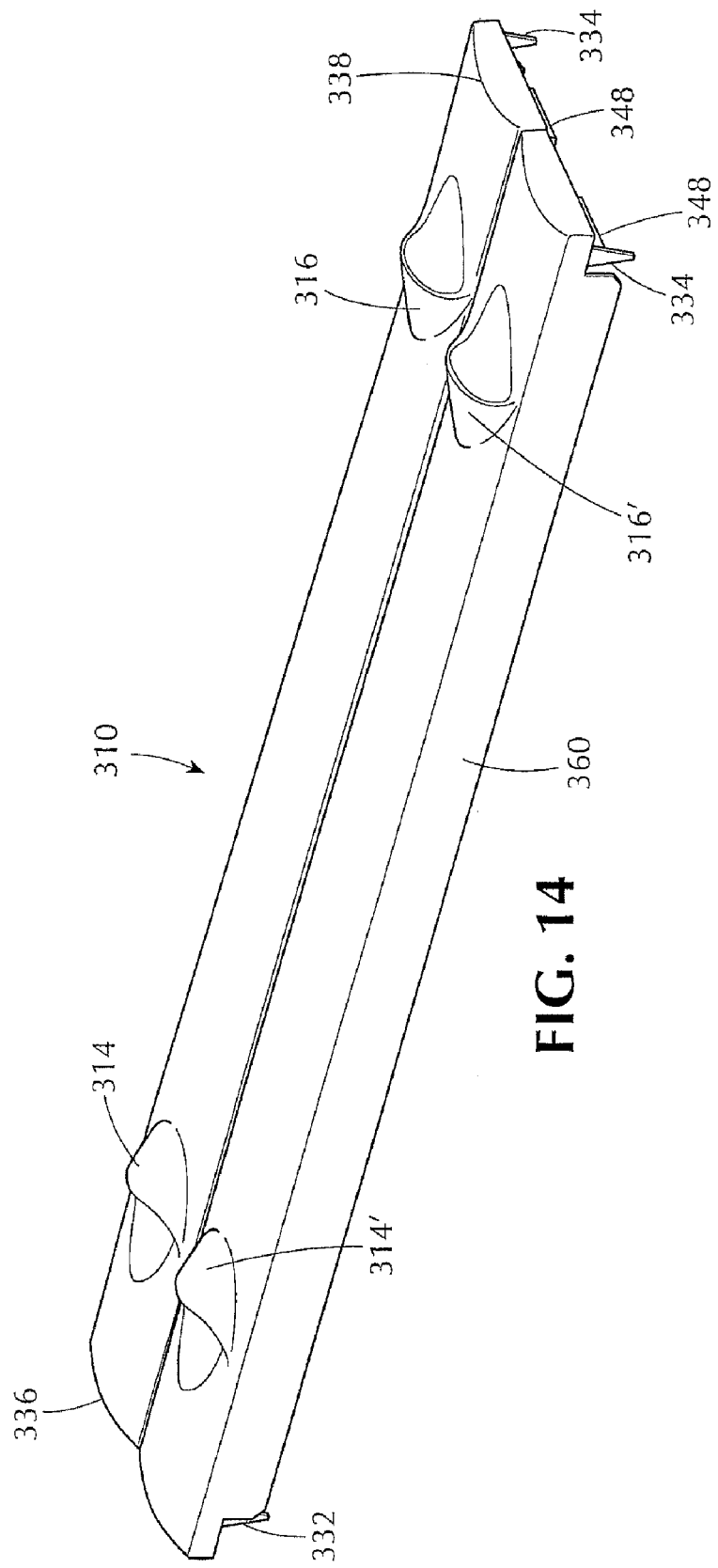
FIG. 14 is a perspective view of a third embodiment of the blanking panel (2 U).

Referring to FIG. 14, a blanking panel 310 provided in a 2 U size preferably has a pair of grips 314, 314' and 316, 316' at each end 336, 338. Similarly, the 2 U blanking panel preferably has, at each end 336, 338 thereof, a pair of stacking supports (not shown), a pair of rail engagement projections 348, and a pair of rail alignment projections 332, 334. However, the 2 U blanking panel may have, at each end 336, 338 thereof, only one grip 314, 316, and/or only one stacking support, and/or only one rail engagement projection 348, and/or only one rail alignment projection 332, 334. In any configuration, however, the 2 U blanking panel preferably has one set of (top and bottom) skirt members 360. It can be appreciated that other sizes of the blanking panel (e.g., 4 U, 8 U, etc.) constructed according to the invention may have similar configurations.

It should be understood, of course, that the specific form of the invention herein illustrated and described is intended to be representative only, as certain changes may be made therein without departing from the clear teachings of the disclosure. Accordingly, reference should be made to the following appended claims in determining the full scope of the invention.

What is claimed is:

1. A blanking panel for occupying one or more mounting locations in an equipment rack or cabinet enclosure having spaced-apart mounting rails for mounting electronic equipment in a closely-spaced manner, which mounting rails define a plurality of predefined mounting locations spaced-apart at regular intervals, said blanking panel comprising:
   a front wall; first and second end portions on opposite lateral sides of said front wall;
   releasable connecting means operable to releasably connect said blanking panel to the mounting rails, with said front wall facing outward, said releasable connecting means being disposed adjacent said first and second end portions of said blanking panel;
   said front wall including first and second grips operable for mounting and removal of said blanking panel to and from the mounting rails;
   means for stacking said blanking panel on a lower blanking panel resting on a horizontal support surface, without external support, where the lower blanking panel has the same construction as said blanking panel;
   said means for stacking being located adjacent opposite ends of said blanking panel and extending rearwardly with respect to said front wall of said blanking panel, and being operable to position said blanking panel at a fixed distance above and parallel to said lower blanking panel and to orient said blanking panel along a horizontal, lateral X axis and along a horizontal Y axis perpendicular to the X axis, relative to said lower blanking panel; and
   said means for stacking including elements engageable with a front wall of said lower blanking panel and operable to limit an extent of horizontal relative movement of said blanking panel along said X and Y axes, with respect to said lower blanking panel.

2. A blanking panel, as in claim 1, further comprising:
   first and second skirt members extending along substantially an entire length of said blanking panel and projecting rearwardly, in a cantilevered manner, from first and second edges, respectively, of said front wall;
   said first and second grips comprising contact members projecting forwardly of said front wall and forming laterally opening finger cavities defining laterally facing edges,
   said means for stacking comprising first and second stacking supports disposed between said first and second skirt members;
   each stacking support including a first portion positioned to engage a contact member of said lower blanking panel;
   each stacking support including a second portion laterally spaced from said first portion of said stacking support,
   said second portions of said stacking supports extending rearwardly with respect to said front wall and being positioned to be in contact with or laterally closely adjacent to laterally facing edges of finger cavities of said lower blanking panel;
   said first portions of said stacking supports orienting and limiting horizontal movement of said blanking panel along said Y axis relative to said lower blanking panel; and
   said second portions of said stacking supports orienting and limiting horizontal movement of said blanking panel along said X axis relative to said lower blanking panel.

3. A blanking panel, as in claim 2, further comprising:
   said first and second grips each including a forwardly-projecting contact member having a forwardly convex shape;
   said front wall having first and second contact areas disposed adjacent said first and second end portions of said front wall, each contact area having a convex shape; and
   radii of curvature of said contact members being substantially less than radii of curvature of said contact areas of said front wall.

4. A blanking panel, as in claim 3, further comprising:
   when said blanking panel is stacked on said lower blanking panel, a center of curvature of said contact areas of said front wall lies substantially below a center of curvature of said contact members.

5. A blanking panel for occupying one or more mounting locations in an equipment rack or cabinet enclosure having spaced-apart mounting rails for mounting electronic equipment in a closely-spaced manner, which mounting rails define a plurality of predefined mounting locations spaced-apart at regular intervals, said blanking panel comprising:
   a front wall; first and second end portions on opposite lateral sides of said front wall;
   releasable connecting means operable to releasably connect said blanking panel to the mounting rails, with said front wall facing outward, said releasable connecting means being disposed adjacent said first and second end portions of said blanking panel;
   said front wall including first and second grips operable for mounting and removal of said blanking panel to and from the mounting rails;
   means for stacking said blanking panel on a lower blanking panel resting on a horizontal support surface, without external support, where the lower blanking panel has the same construction as said blanking panel;

said means for stacking extending rearwardly with respect to said front wall of said blanking panel, and being operable to orient said blanking panel along a horizontal, lateral X axis and along a horizontal Y axis perpendicular to the X axis, relative to said lower blanking panel; and said means for stacking being operable to limit relative movement of said blanking panel along said X and Y axes, with respect to said lower blanking panel, said means for stacking including first stacking elements projecting rearwardly from said front wall and engageable with said first and second grips to limit relative movement of said blanking panel along said Y axis, with respect to said lower blanking panel;

said first and second grips having laterally facing edges, facing in opposite lateral directions, and said means for stacking further including laterally spaced apart second stacking elements projecting rearwardly from said front wall and positioned for engagement with laterally facing edges of said first and second grips of said lower blanking panel to limit movement of said blanking panel along said X axis, with respect to said lower blanking panel.

6. A blanking panel, as in claim 5, further comprising;

a pair of spaced apart alignment projections extending rearwardly from the back of said front wall adjacent to each end portion of said blanking panel;

rearward end extremities of said alignment projections being positioned adjacent to or in contact with an outer surface of a front wall of said lower blanking panel to limit or prevent rotation of said blanking panel about said X axis, with respect to said lower blanking panel.

7. A blanking panel, as in claim 5, wherein;

said grips have forwardly projecting portions formed with forwardly convex contours;

said first stacking elements are formed with rearwardly concave contours complimentary with the convex contours of said grips and serving to limit relative movement of said blanking panel along said Y axis, with respect to said lower blanking panel.

8. A blanking panel, as in claim 7, further comprising;

a pair of spaced apart alignment projections extending rearwardly from said front wall adjacent to each end portion of said blanking panel;

rearward end extremities of said alignment projections being positioned adjacent to or in contact with an outer surface of a front wall of said lower blanking panel to limit or prevent rotation of said blanking panel about said X axis, with respect to said lower blanking panel.

9. A blanking panel as in claim 8, wherein said front wall is formed with a forwardly convex front surface, said convex front surface and said forwardly projecting portions of said grips each having a radius of curvature, and the radius of curvature of the forwardly projecting portions of said grips being substantially less than the radius of curvature of said convex front surface.

10. A blanking panel as in claim 8, wherein said front wall is formed with a forwardly convex front surface, said convex front surface and said forwardly projecting portions of said grips each have a center of curvature, and the center of curvature of the forwardly projecting portions of said grips is spaced forwardly of the center of curvature of said convex front surface.

11. A blanking panel as in claim 5, wherein said grips have portions extending forwardly of said front wall and defining finger receiving cavities disposed at an acute angle to the front wall, and said forwardly extending portions of said grips define edges engageable by said second stacking elements.

12. A blanking panel as in claim 11, wherein said finger receiving cavities are of closed cross sectional shapes and have openings facing laterally outward toward the end portions of said blanking panel, and said second stacking elements are positioned to extend rearward from bottom wall portions of said cavities and, when said blanking panel is stacked onto a lower blanking panel, to extend at adjacent to the finger-receiving cavities of said lower blanking panel.

13. A blanking panel according to claim 11, wherein said blanking panel is configured as two panels, each of a height of 1 U, to form a rigid double panel of a height of 2 U, said double panel having at least one set of first and second grips and at least one set of first and second stacking means associated with said grips for limiting movement of said double panel along said X and Y axes, with respect to a similar double panel positioned directly below.

* * * * *